United States Patent
Fujiwara

(10) Patent No.: US 7,952,686 B2
(45) Date of Patent: May 31, 2011

(54) STAGE APPARATUS, EXPOSURE APPARATUS, AND DEVICE MANUFACTURING METHOD

(75) Inventor: Yasuhiro Fujiwara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 517 days.

(21) Appl. No.: 12/060,395

(22) Filed: Apr. 1, 2008

(65) Prior Publication Data

US 2008/0259309 A1    Oct. 23, 2008

(30) Foreign Application Priority Data

Apr. 19, 2007   (JP) ................... 2007-110833

(51) Int. Cl.
*G03B 27/62* (2006.01)
*G03B 27/58* (2006.01)

(52) U.S. Cl. ........................... 355/75; 355/72
(58) Field of Classification Search ............ 355/75, 355/72
See application file for complete search history.

(56) References Cited

U.S. PATENT DOCUMENTS

| | | | |
|---|---|---|---|
| 6,570,645 B2 | 5/2003 | Korenaga et al. | |
| 7,307,698 B2 | 12/2007 | Miyajima et al. | 355/75 |
| 7,333,180 B2 | 2/2008 | Tanaka | 355/72 |
| 2002/0145721 A1 | 10/2002 | Korenaga et al. | |
| 2003/0098966 A1 | 5/2003 | Korenaga et al. | |
| 2005/0185166 A1 | 8/2005 | Miyajima et al. | 355/75 |
| 2005/0200827 A1 | 9/2005 | Tanaka | 355/72 |
| 2006/0209289 A1 | 9/2006 | Fujiwara | 355/75 |

FOREIGN PATENT DOCUMENTS

| | | |
|---|---|---|
| JP | 2000-106344 | 4/2000 |
| JP | 2006-041302 | 2/2006 |

OTHER PUBLICATIONS

Extended European Search Report (including European search opinion) dated Jul. 16, 2008, mailed in a Communication dated Jul. 29, 2008, in copending European patent application No. 08 15 3901.

*Primary Examiner* — Peter B Kim
(74) *Attorney, Agent, or Firm* — Fitzpatrick, Cella, Harper & Scinto

(57) ABSTRACT

A stage apparatus that includes a stage and moves the stage in at least a first direction. The stage apparatus also includes a plurality of holding units fixed on the stage to extend in the first direction, in which the first direction is a longitudinal direction. Each of the holding units includes a first portion. A second portion is arranged between the first portion and the stage and a third portion is arranged between the second portion and the stage. The first portion includes a holding surface to hold an object. A length of the second portion in the first direction is less than a length of the first portion in the first direction, and the length of the second portion in the first direction is less than a length of the third portion in the first direction. Ends of the second portion are determined by two slits extending from both ends of the holding units in the first direction towards a central portion of the holding units, and the first portion is connected to the third portion at only one point via the second portion.

9 Claims, 12 Drawing Sheets

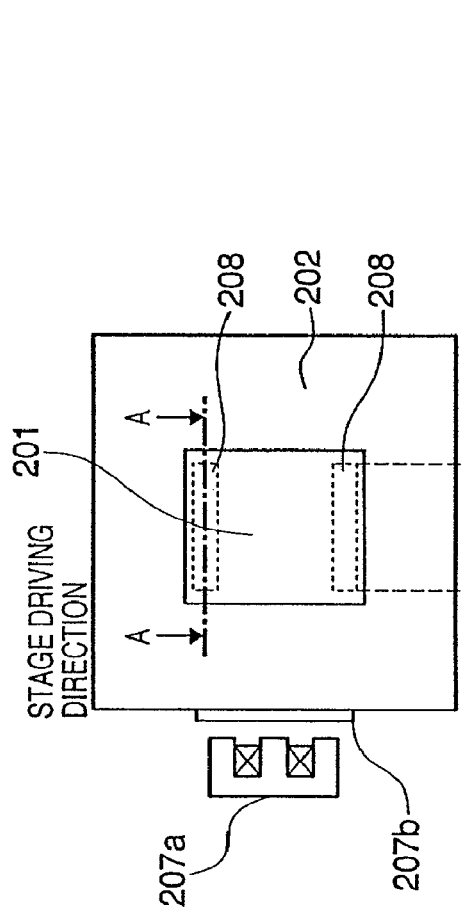
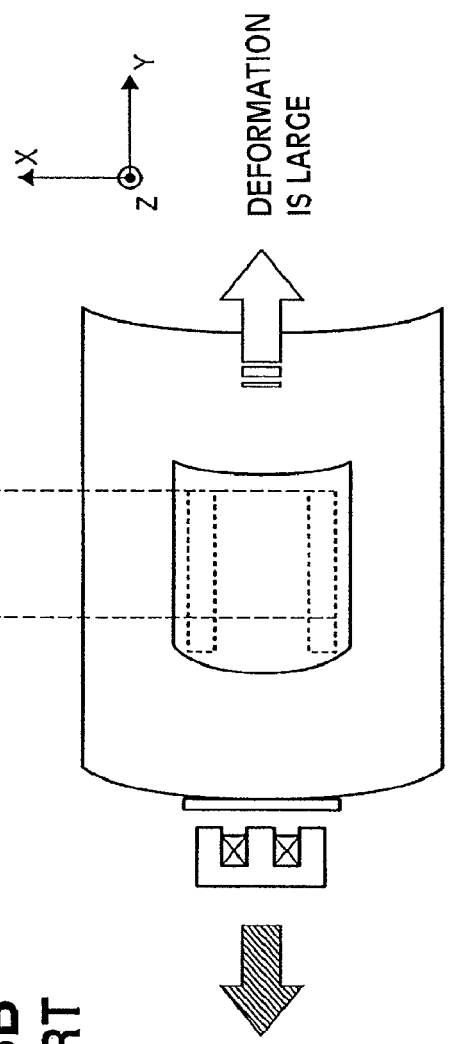
FIG. 3A PRIOR ART
FIG. 3B PRIOR ART

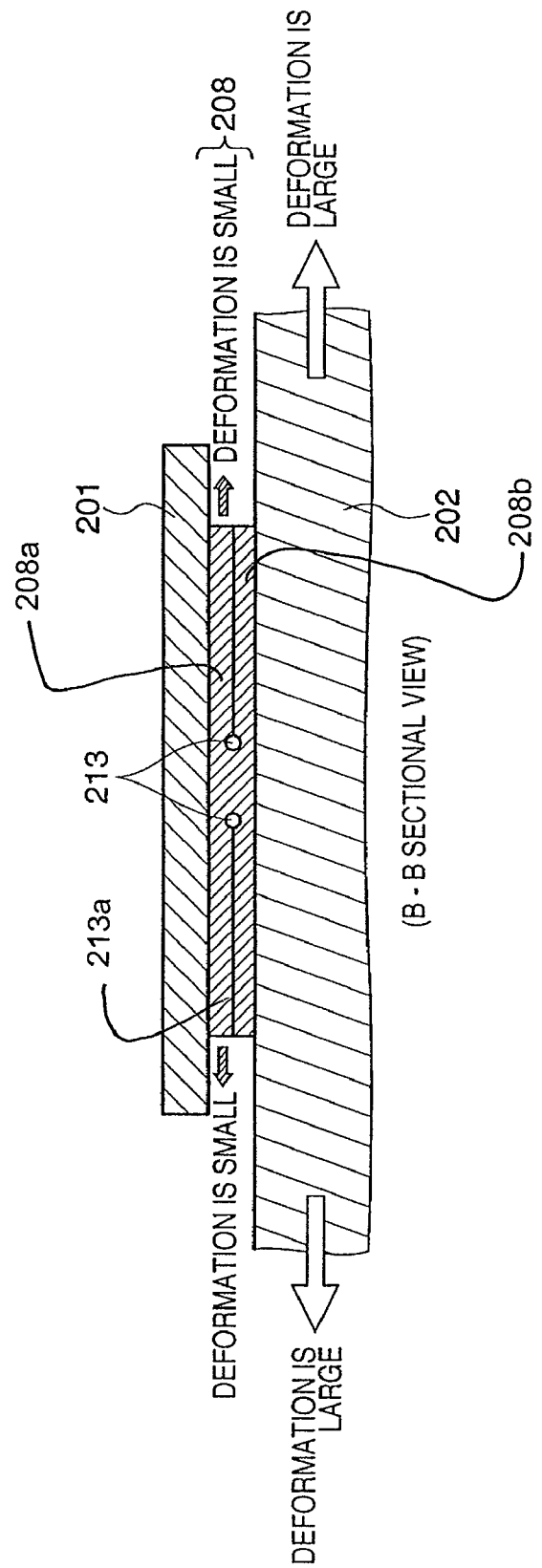

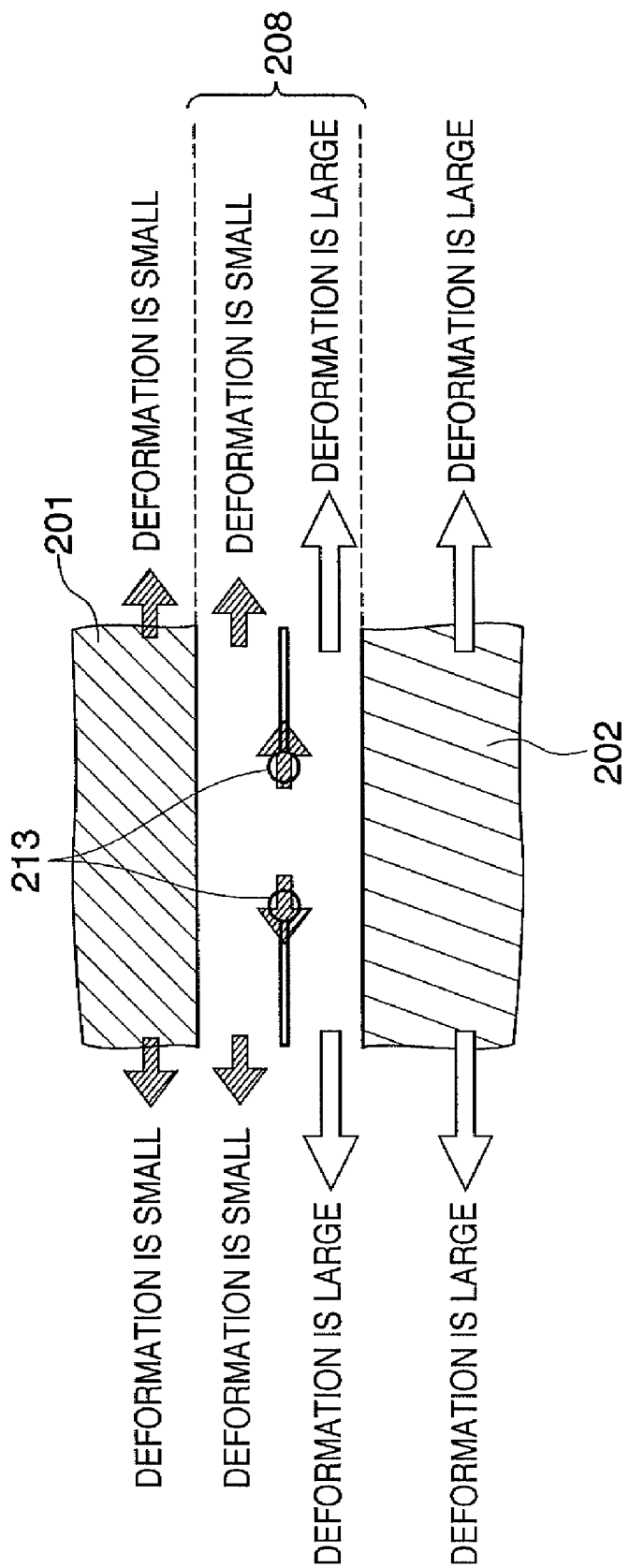

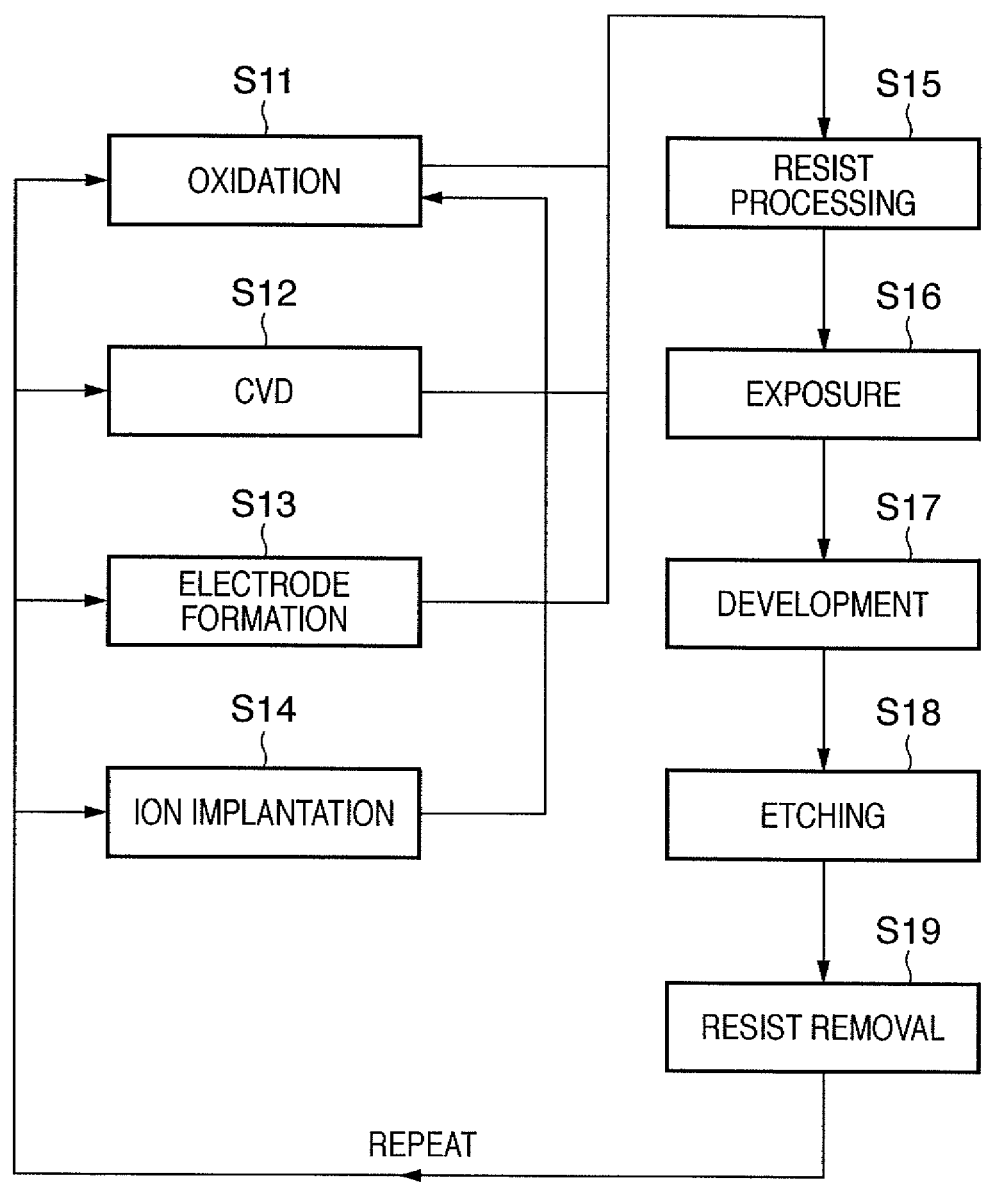

STAGE APPARATUS, EXPOSURE APPARATUS, AND DEVICE MANUFACTURING METHOD

This application claims the benefit of Japanese Patent Application No. 2007-110833, filed Apr. 19, 2007, which is hereby incorporated by reference herein in its entirety.

BACKGROUND OF THE INVENTION

1. Field of the Invention

The present invention relates to a stage apparatus, which holds a reticle (original) in, for example, an exposure apparatus, an exposure method, and a device manufacturing method.

2. Description of the Related Art

An exposure apparatus for manufacturing a semiconductor device has a reticle stage and a wafer stage for aligning a reticle (mask) as an original, and a wafer as a substrate. To attain high-precision alignment in such an alignment stage apparatus, a method of providing a coarse moving stage, which moves with a large stroke, and a fine moving stage, which moves with a small stroke, to the apparatus, is disclosed in each of Japanese Patent Laid-Open No. 2000-106344, and "Ultraprecision Manufacturing Technology, Vol. 3; Technology of Measurement and Control" (first edition, Jul. 15, 1995, issued by Fuji Technosystem, pages 20-27, supervised by Akira Kobayashi).

FIGS. 8A and 8B are views showing a stage apparatus having coarse and fine moving mechanisms as described in Japanese Patent Laid-Open No. 2000-106344. A support frame (coarse moving stage) 306 connected to a feed screw system movable unit 311 for moving it with a large stroke can move on a plane guide 302. The support frame 306 has linear motor stators 305 for moving a stage (fine moving stage) 301 having linear motor movable elements 304 with a small stroke. The support frame 306 generates, together with the stage 301, a force that allows the stage 301 to move finely relative to the support frame 306.

The support frame 306 also has a pair of electromagnets 308, which sandwich the stage 301 in the Y-axis direction. Each electromagnet 308 functions as an electromagnetic coupling by generating an attraction force together with a magnetic plate 307 provided to the stage 301. As the support frame 306 accelerates/decelerates with a high acceleration/deceleration, it transmits an acceleration/deceleration force to the stage 301, using the attraction force of one of the pair of electromagnets 308.

FIGS. 3A and 3B are views showing deformation of a fine moving stage 202 upon accelerating/decelerating. FIG. 3A shows the state of the fine moving stage 202 before acceleration/deceleration. FIG. 3B shows the state in which a coarse moving stage 203 moves in the −Y direction with acceleration/deceleration to apply an acceleration/deceleration force to the fine moving stage 202 in the −Y direction. FIGS. 3A and 3B do not illustrate any electromagnets that are not involved in the force application. The fine moving stage 202 deforms to extend mainly in the Y-axis direction upon receiving the force.

FIG. 4 is a side view for explaining the section (A-A section) of FIG. 3A in the scanning direction, while the reticle holding unit 208 fixed on the fine moving stage 202 holds and aligns a reticle 201 in FIG. 3A. Deformation of the fine moving stage 202 upon accelerating/decelerating it is transmitted to the reticle 201 via the reticle holding unit 208. As deformation of the fine moving stage 202, upon accelerating/ decelerating is transmitted to the reticle 201, it becomes impossible to attain high-precision alignment. Deformation of the reticle 201 makes it difficult to accurately transfer a reticle pattern drawn on it onto a silicon wafer.

In recent years, a demand has arisen for a stage apparatus that has a higher precision. For example, as shown in FIG. 3A, assume that each electromagnetic coupling transmits a force to the fine moving stage using an attraction force. When the fine moving stage is pulled by a large force from one side in one direction, it deforms, and the reticle (mask) held by the fine moving stage also deforms. These deformations pose a serious problem, especially, in a stage apparatus for an exposure apparatus, which is required to have a position reproducibility and allowable deformation amount on the order of nanometers.

SUMMARY OF THE INVENTION

It is an object of the present invention to suppress an object held by a stage from deforming due to deformation of the stage generated upon accelerating/decelerating the stage.

According to a first aspect of the present invention, a stage apparatus, which includes a stage and moves the stage in at least a first direction, comprises a holding unit fixed on the stage to extend in the first direction, the holding unit including a first portion and a second portion inserted between the first portion and the stage, the first portion including a holding surface configured to hold an object, wherein a length of the second portion in the first direction is less than a length of the first portion in the first direction.

According to a second aspect of the present invention, a stage apparatus, which includes a stage and moves the stage in at least a first direction, comprises a holding unit extending along the first direction and having a first surface for holding an object and a second surface that is connected to the stage, the holding unit having a hinge portion whose ends are determined by two slits extending from both ends of the holding unit in the first direction towards a central portion of the holding unit, wherein a length of the hinge portion in the first direction is less than a length of the first surface in the first direction and a length of the second surface in the first direction.

According to the present invention, it is possible to suppress an object held by a stage from deforming due to deformation of the stage generated upon accelerating/decelerating the stage.

Further features of the present invention will become apparent from the following description of exemplary embodiments, with reference to the attached drawings.

BRIEF DESCRIPTION OF THE DRAWINGS

FIGS. 3A and 3B are plan views showing deformation of a fine moving stage according to a prior art arrangement;

FIG. 5A is a side view showing an example of a fine moving stage according to the present invention;

FIG. 5C is a partial enlarged view of FIG. 5A;

FIG. 10 is a flowchart illustrating details of the wafer process in step S4 of the flowchart shown in FIG. 9.

DESCRIPTION OF THE EMBODIMENTS

Embodiment of Stage Apparatus

Figure 1:
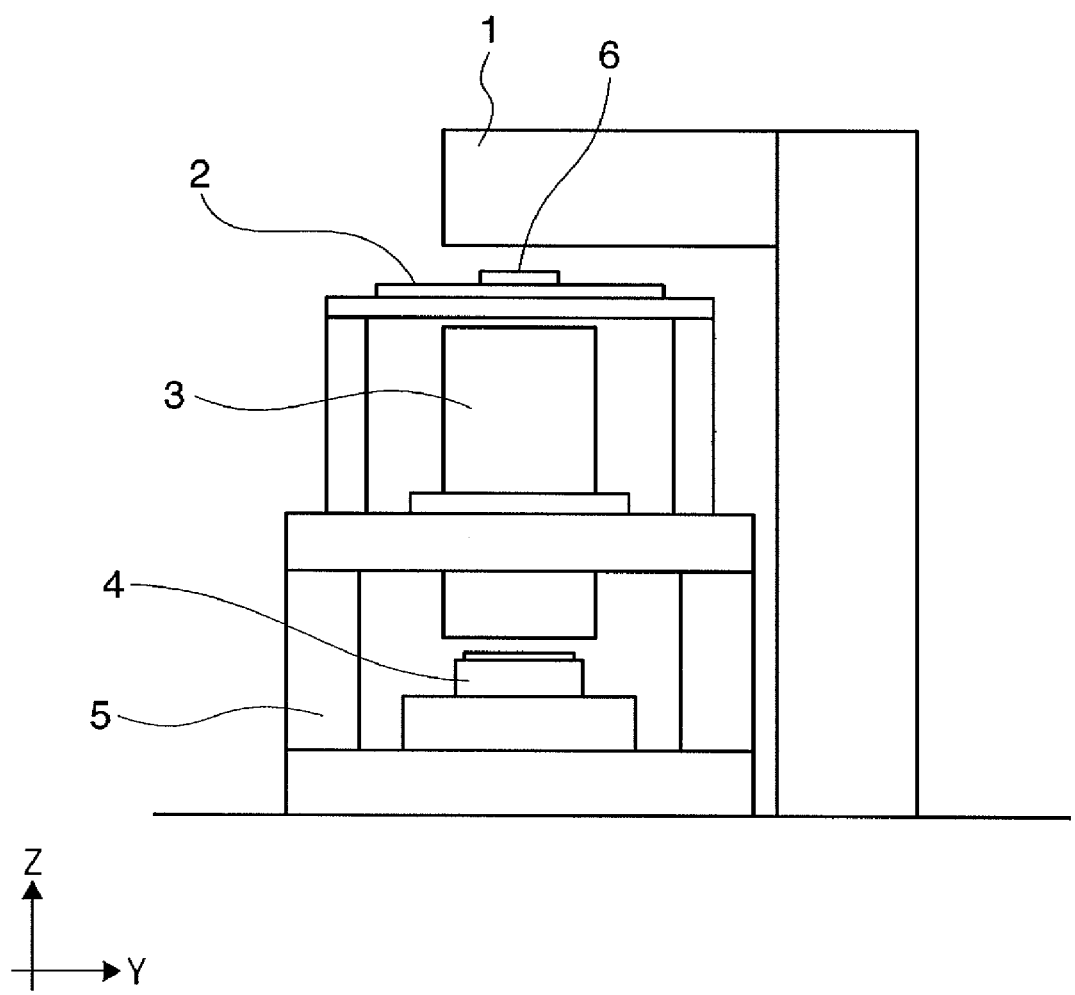
FIG. 1 is a view showing the entire arrangement of an exposure apparatus.

FIG. 1 is a view showing the entire apparatus according to an embodiment in which an exemplary stage apparatus according to the present invention is applied to an original stage (reticle stage) of an exposure apparatus. An illumination optical system 1 shapes exposure light emitted by a light source into uniform exposure light. A reticle stage 2 mounts an original (reticle) 6 and exposes the reticle 6 by scanning the reticle 6 relative to the exposure light. A projection optical system 3 projects and transfers the pattern on the reticle 6 onto a wafer formed by a silicon substrate. A wafer stage 4 mounts a wafer as a silicon substrate and moves the wafer by scanning the wafer relative to the exposure light, in synchronism with the reticle stage 2. An exposure apparatus main body 5 supports, for example, the reticle stage 2, projection optical system 3, and wafer stage 4. A projection pattern is formed on the reticle 6.

Figure 2:
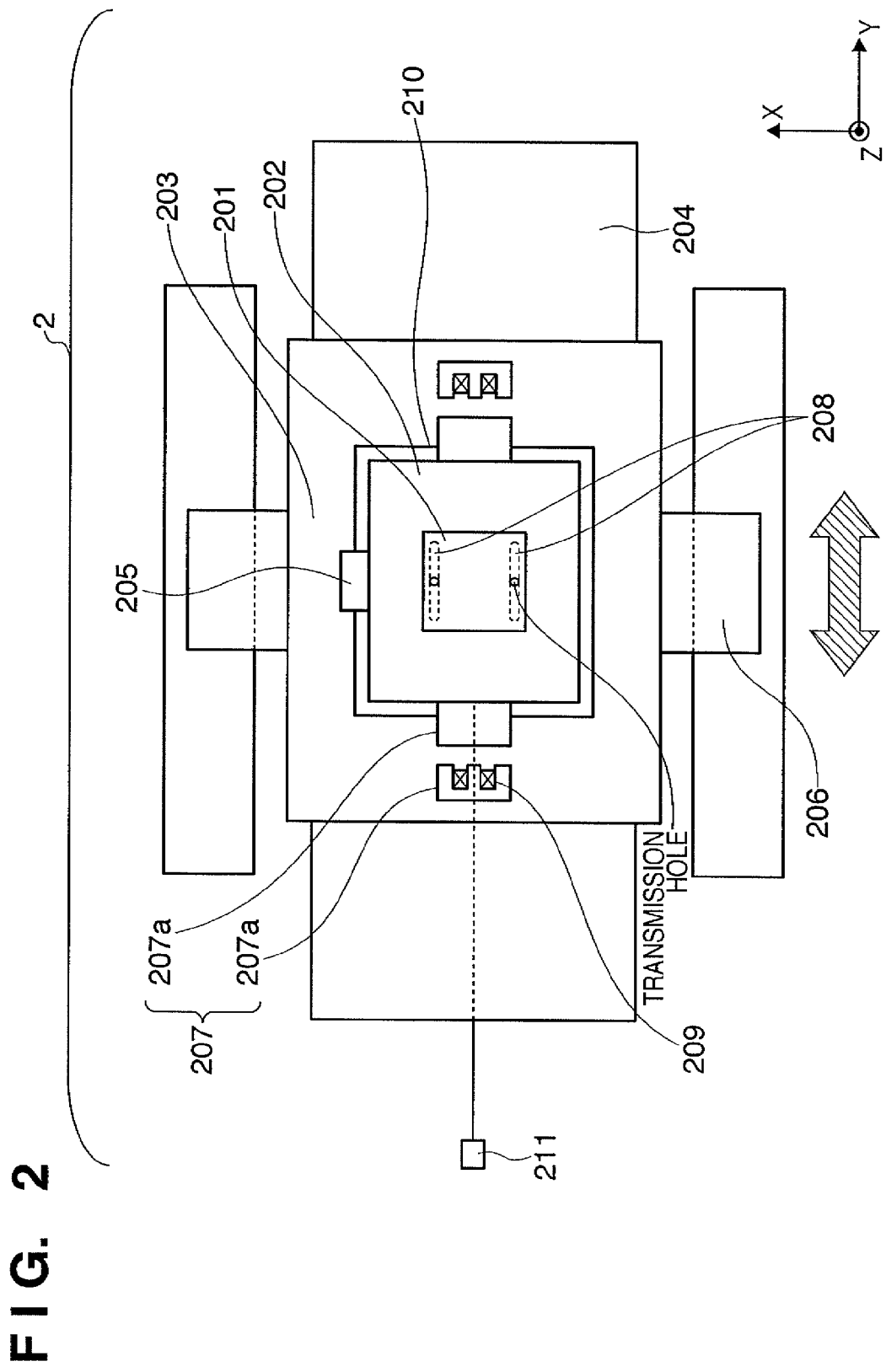
FIG. 2 is a view showing a reticle stage.
Figure 4:
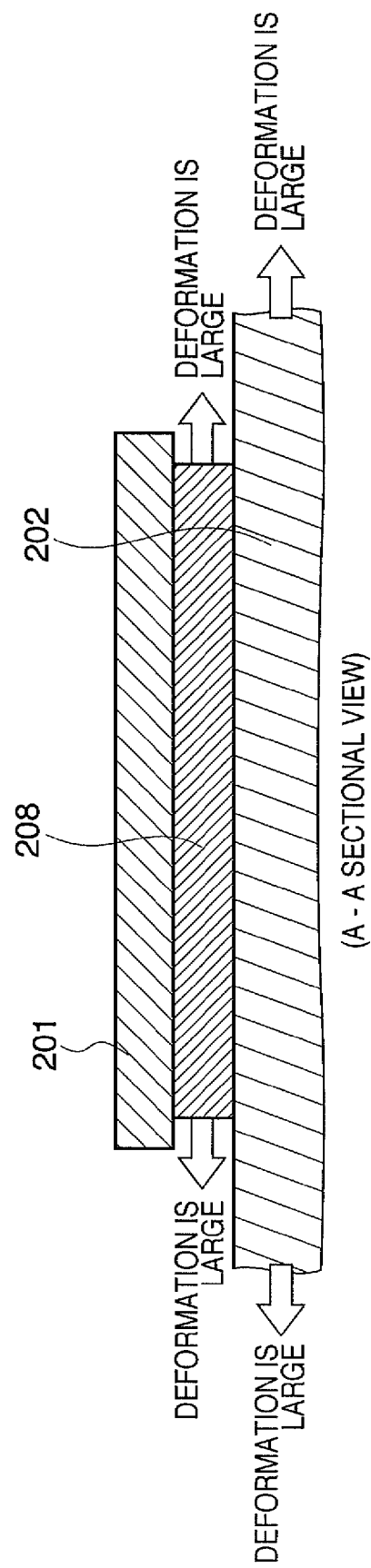
FIG. 4 is a side view of FIG. 3A.

FIG. 2 is a view showing the reticle stage 2 according to this embodiment. The reticle stage 2 can have a coarse moving stage 203 and a fine moving stage 202. The coarse moving stage 203 is supported to be movable on the upper surface of a base 204, and can be moved with a large stroke in the Y-axis direction, as the scanning direction, by a coarse movement linear motor 206. The coarse movement linear motor 206 has a stator and a movable element. The stator includes a coil unit (not shown) supported by the base. The movable element includes a magnet fixed on the coarse moving stage 203. A Lorentz force is generated between the stator and the movable element to drive the coarse moving stage 203. The driving mechanism of the coarse moving stage 203 is not particularly limited to a linear motor, and may be of another type.

The coarse moving stage 203 has, at its central portion, an opening 210 that propagates exposure light. The fine moving stage 202, which mounts a reticle 201, is inserted in the opening 210 and is supported with low rigidity from the coarse moving stage 203 via a spring mechanism (including, for example, an air bearing, not shown). A fine movement linear motor 205 and electromagnetic couplings 207 are interposed between the fine moving stage 202 and the coarse moving stage 203. The fine movement linear motor 205 can finely move the fine moving stage 202 relative to the coarse moving stage 203. The fine movement linear motor 205 drives the fine moving stage 202 in a non-contact manner using the Lorentz force between the coil and the magnet, as exemplified in the prior art. The fine movement linear motor 205 can be arranged so as to finely drive the fine moving stage 202 in three axial directions, i.e., in the X direction, Y (scanning) direction, and Z (vertical) direction. The fine movement linear motor 205 can also be arranged so as to finely drive the fine moving stage 202 in six axial directions, including three rotational directions about the X-, Y-, and Z-axis, in addition to the above-described directions. The number of axes and axial directions may be freely changed in accordance with design details, such as the required precision and space. A laser interferometer 211 measures the position of the fine moving stage 202 in three axial directions or six axial directions.

Each electromagnetic coupling 207 has, for example, an I core 207a as a magnetic material attached on the fine moving stage 202, an E core 207b as a magnetic material attached on the coarse moving stage 203, and an electromagnetic coupling coil 209 wound around the E core 207b.

Reticle holding units 208 are each fixed on the fine moving stage 202 and made of a material identical to or different from that of the fine moving stage 202. This material is an elastically deformable member. The elastically deformable member here includes general elastic metal and resin materials, and general fragile glass and ceramic materials.

Each reticle holding unit 208 has a chucking mechanism for holding and aligning the reticle 201, and a measurement light transmission hole for aligning the reticle 201. More specifically, light from a light emitting unit (not shown) irradiates the reticle 201 from above, is transmitted through a mark formed on the reticle 201, propagates through a measurement light transmission hole, and enters a light-receiving unit provided under the fine moving stage 202. The light-receiving unit comprises, for example, a camera sensor, which allows for detecting the relative position between the reticle 201 and the light-receiving unit. Furthermore, the fine moving stage is moved so that a reference mark formed on it falls within the detection range of the light-receiving unit, thereby detecting the relative position between the reference mark and the light-receiving unit. This makes it possible to obtain information on the relative positional shift between the reticle 201 and the fine moving stage 202 from the movement amount of the stage measured by the interferometer and the relative position between the light-receiving unit and each mark. The resultant relative positional shift information can be reflected in the driving of the fine moving stage 202.

Figure 5B:
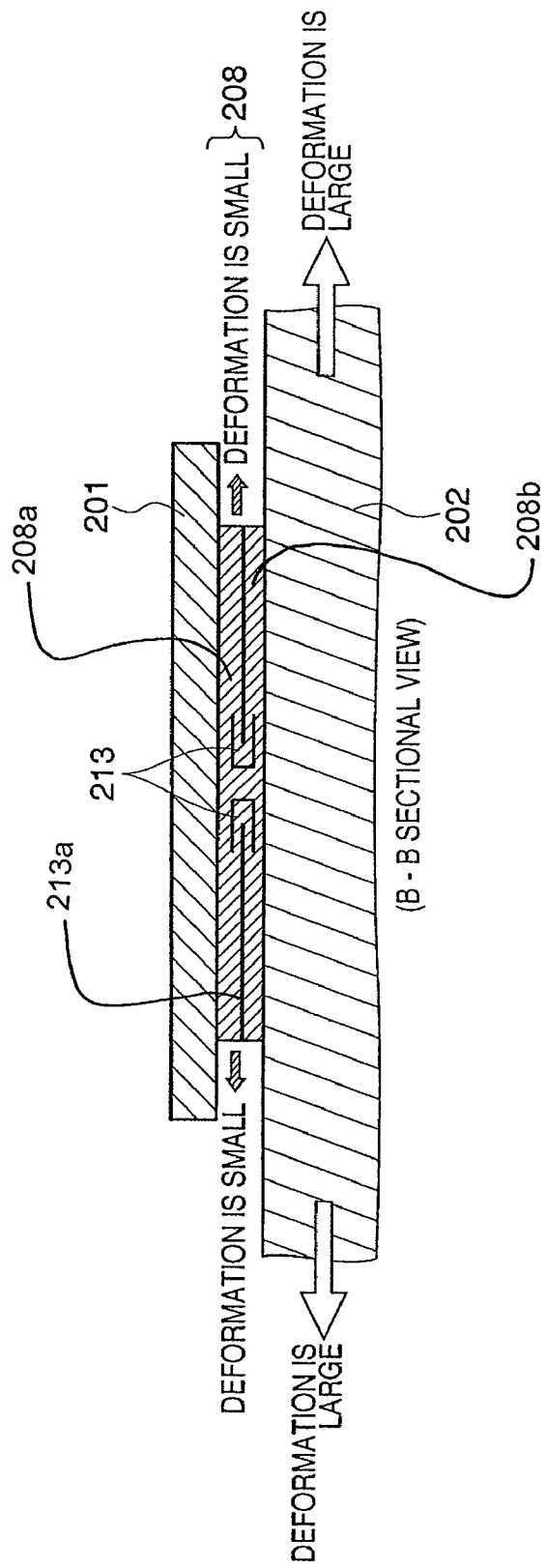
FIG. 5B is a side view showing another example of the fine moving stage according to the present invention.
Figure 6A:
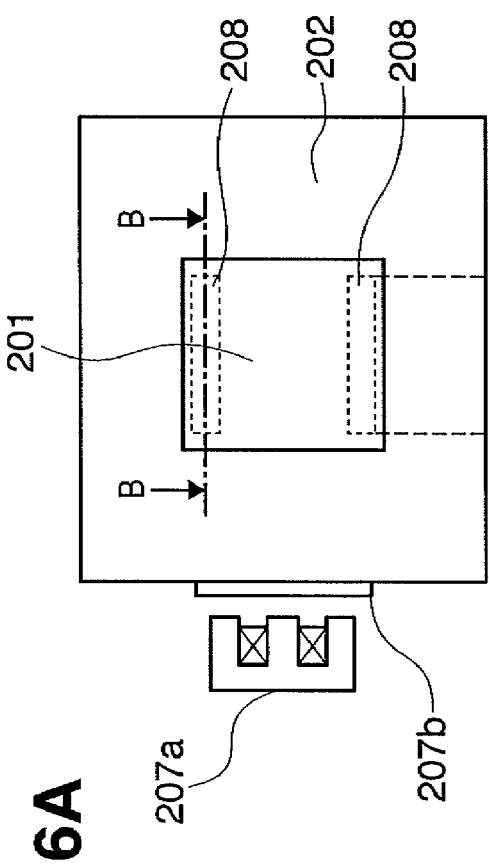
FIGS. 6A and 6B are plan views showing deformation of the fine moving stage.

FIG. 5A is a side view for explaining the section (B-B section) of FIG. 6A in the scanning direction while the reticle holding unit 208, fixed on the fine moving stage 202, holds the reticle 201. The reticle holding unit 208 is fixed on the fine moving stage 202 to extend in a first direction in which the fine moving stage 202 moves. The reticle holding unit 208 includes a first portion 208a having a holding surface that holds a reticle (object), a second portion inserted between the first portion 208a and the fine moving stage 202, and a third portion 208b inserted between the second portion and the fine moving stage 202. In this embodiment, the second portion is an elastic hinge portion, which connects the first portion 208a to the third portion 208b, via elastic hinges 213, which are contained in slits 213a. Although the reticle holding unit 208 includes the third portion 208b in this embodiment, it need not necessarily include the third portion 208b.

The fine moving stage 202 deforms upon receiving an acceleration/deceleration force. However, elastic hinges 213, provided in the same direction as the deformation direction of the fine moving stage 202, suppress deformation of the fine moving stage 202 from being transmitted to the reticle 201. At the same time, the elastic hinges 213 suppress heat generated by the fine moving stage 202 from being transferred to the reticle 201. FIG. 5B shows a modification of the reticle holding unit 208.

FIG. 5C is a partial enlarged view of the elastic hinges 213, shown in FIG. 5A, for explaining the state in which the elastic hinges 213 suppress deformation of the fine moving stage 202 from being transmitted to the reticle 201. Deformation of the fine moving stage 202 is transmitted to the reticle holding unit 208 due to friction between them. The elastic hinges 213 reduce the deformation of the reticle holding unit 208 transmitted to the reticle 201, to be less than the original deformation of the fine moving stage 202.

An effect of suppressing the reticle holding unit 208 from deforming due to deformation of the fine moving stage 202, as described above, can be controlled by changing the size of the elastic hinge portion of the reticle holding unit 208. More specifically, assume that the reticle holding unit 208 deforms by 100 nm due to deformation of the fine moving stage 202 upon accelerating/decelerating the stage with a certain acceleration. If the allowable deformation amount of the reticle 201 is 10 nm, the elastic hinges 213 in the reticle holding unit 208 reduce its deformation to 1/10. Considering the nature of general elastic deformation, it is possible to reduce the deformation of the reticle 201 to 1/10 by adjusting the ratio between the size of the elastic hinge 213 and reticle holding unit 208 to a deformation reduction ratio (in this example, 1/10). For example, if the reticle holding unit 208 has a size of 130 mm, the size of the elastic hinge 213 is 130 mm×1/10=13 mm. When the conventional reticle holding unit deforms by 100 nm, this deformation is directly transmitted to the reticle. That is, it is possible to suppress the deformation of the reticle 201 by adjusting the length of the second portion in the first direction, in which the fine moving stage 202 moves, to be less than that of the third portion. Although the length of the second portion is 10% of the lengths of the first portion and the third portion, in the above-described arrangement, the length ratio of the second portion can be changed by taking account a reticle deformation suppression action and a stable reticle holding action. For example, even when the length of the second portion is adjusted to 70% or less of the lengths of the first portion and the third portion by attaching importance to stable reticle holding, the reticle deformation can be suppressed sufficiently. However, when importance is attached to reticle deformation suppression, the length ratio of the second portion is desirably 50% or less and, more desirably, 30% or less.

Figure 6B:
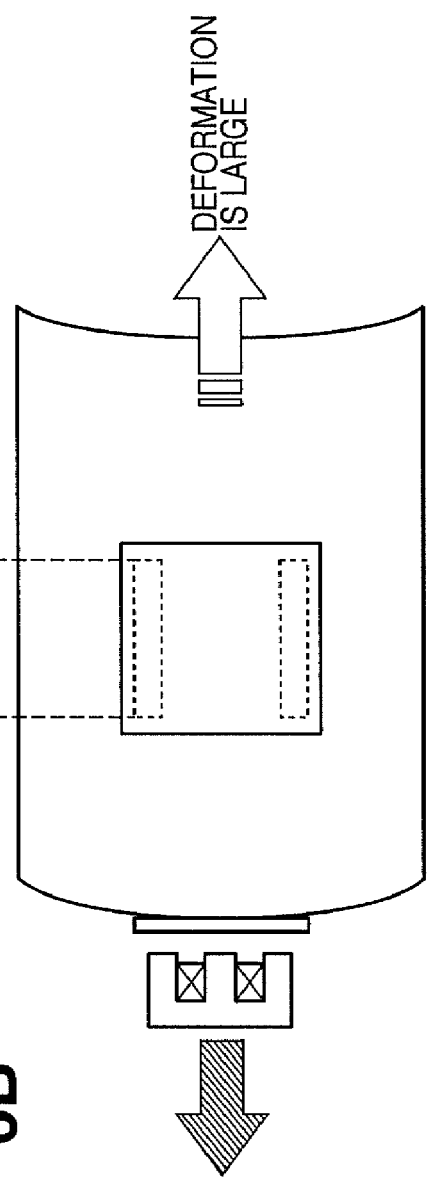

FIGS. 6A and 6B are plan views for explaining deformation of the fine moving stage 202 upon accelerating/decelerating the stage. FIG. 6A shows the state of the fine moving stage 202 before the acceleration/deceleration. FIG. 6B shows the state in which the coarse moving stage 203 moves in the −Y direction with acceleration/deceleration, to apply an acceleration/deceleration force to the fine moving stage 202 in the −Y direction. FIGS. 6A and 6B do not illustrate any electromagnets that are not involved in the force application. The fine moving stage 202 deforms to extend mainly in the Y-axis direction upon receiving the force. However, the deformation of the reticle 201 is suppressed by an effect of suppressing deformation of the reticle holding unit 208 in its elastic hinge portion (second portion).

Figure 7A:
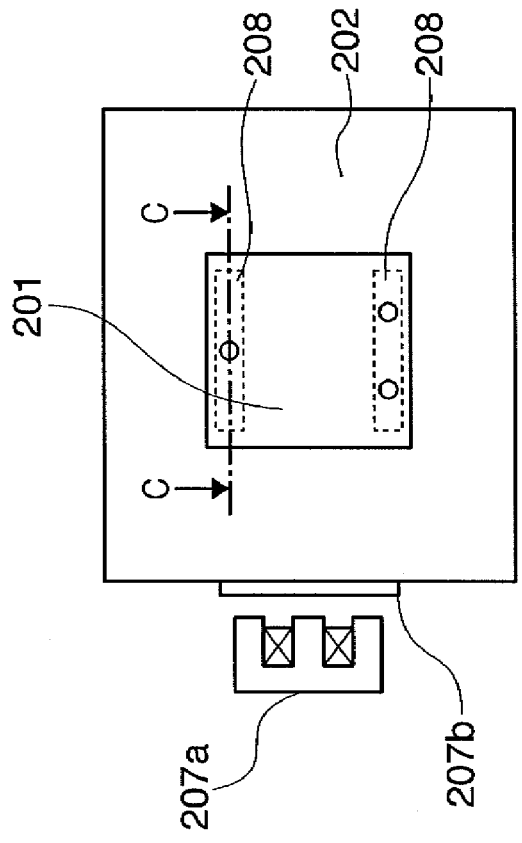
FIGS. 7A and 7B are a plan view and a side view showing an arrangement that supports an original (reticle) at three points.
Figure 7B:
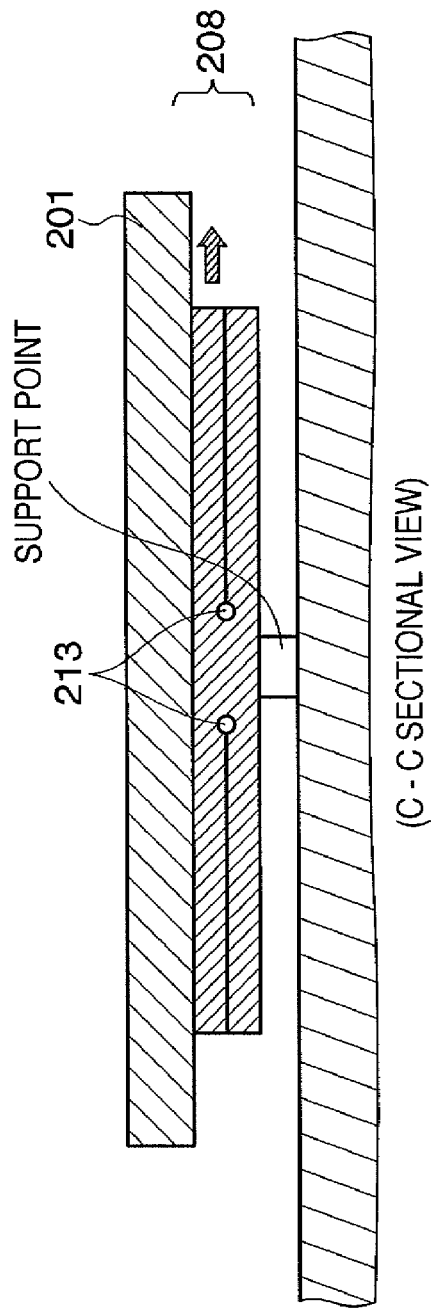
Figures 8A, 8B:
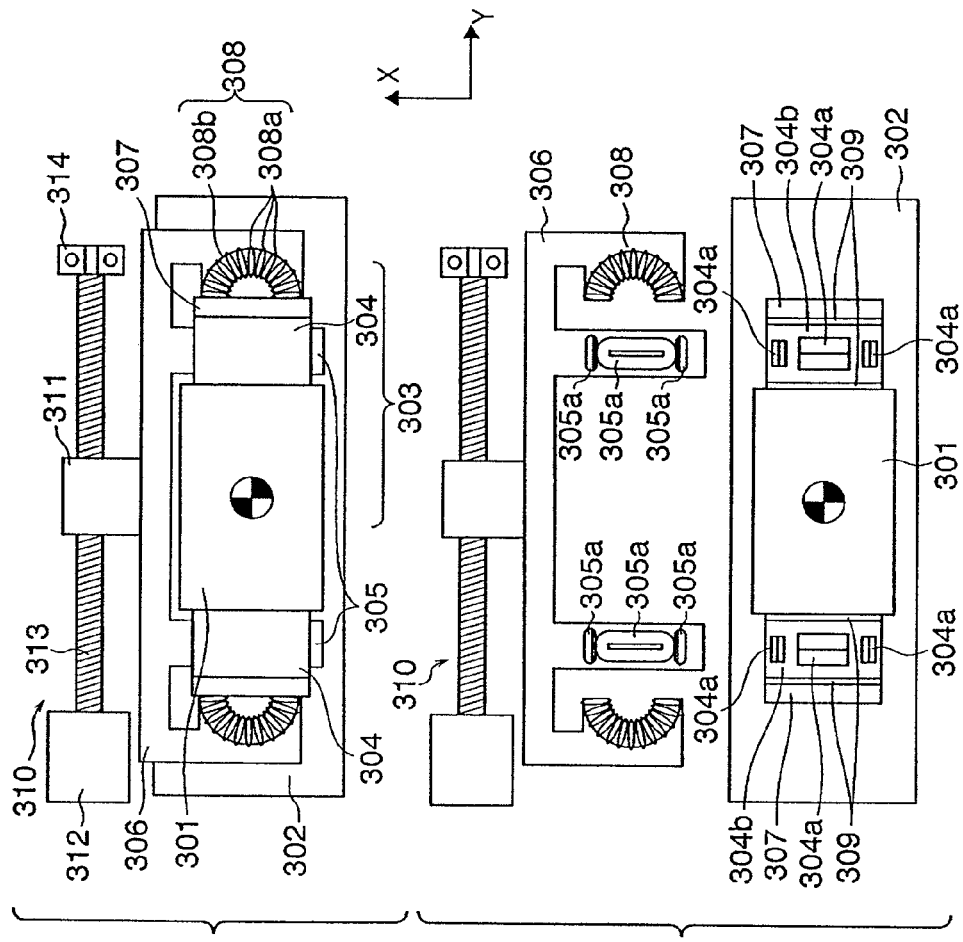
FIGS. 8A and 8B are views showing a stage apparatus according to a prior art arrangement.

As shows in FIGS. 7A and 7B, reticle holding units 208 are separately provided in a plurality of portions on the fine moving stage 202, and can support the reticle 201 at three points on the fine moving stage 202.

When the reticle holding unit 208 is made of a low-thermal expansion material, such as Invar™, ceramic, or glass, it is possible to prevent the fine moving stage 202 from thermally deforming, due to heat generated by an actuator as it drives the reticle stage 2 with a high acceleration. To reduce the thermal deformation, the linear expansion coefficient of the low-thermal expansion material is, preferably, 0.7 ppm/° C. or less around 23° C. and, more preferably, 0.1 ppm/° C. or less for more effective deformation suppression.

The stage apparatus according to this embodiment is applicable not only to a reticle stage, but also, to a high-precision stage apparatus. Although an arrangement in which a coarse moving stage coarsely moves in the scanning direction as one axial direction has been exemplified above, an arrangement in which the stage coarsely moves in two axial directions may be adopted. As a concrete example, the stage apparatus according to this embodiment is applicable to a wafer stage similarly built in an exposure apparatus.

The exposure apparatus according to this embodiment projects and transfers by exposure a circuit pattern formed on a reticle onto a wafer, and may adopt a step and repeat projection exposure scheme or a step and scan projection exposure scheme. The illumination optical system 1 illuminates a reticle on which a circuit pattern is formed, and has a light source unit and an illumination system. The light source unit uses, for example, a laser as a light source. The laser can be, for example, an ArF excimer laser with a wavelength of about 193 nm, a KrF excimer laser with a wavelength of about 248 nm, or an $F_2$ excimer laser with a wavelength of about 153 nm. The type of laser is not particularly limited to an excimer laser, and may be, for example, a YAG laser. The number of lasers used is not particularly limited as well. When a laser is used as the light source, a light beam shaping optical system that shapes a collimated light beam from the laser light source into a desired beam shape, and an incoherent optical system, which converts a coherent laser light beam into an incoherence light beam, are preferably used. In addition, the light source that can be used for the light source unit is not particularly limited to a laser. It is also possible to use one or a plurality of lamps, such as a mercury lamp or a xenon lamp.

The illumination optical system 1 illuminates a mask and includes, for example, a lens, a mirror, a light integrator, and a stop. The projection optical system 3 can be, for example, an optical system including a plurality of lens elements alone, an optical system (catadioptric system) including a plurality of lens elements and a concave mirror, an optical system including a plurality of lens elements and a diffractive optical element, such as a kinoform, or an optical system including a total reflection mirror.

The reticle stage 2 and wafer stage 4 can be moved, for example, by a linear motor. When the exposure apparatus adopts a step and scan projection exposure scheme, the stages 2 and 4 move in synchronism with each other. An actuator is separately provided to at least one of the wafer stage 4 and reticle stage 2, to align the pattern of the reticle 6 onto the wafer. Such an exposure apparatus can be used to manufacture a device, on which a micropattern is formed, for example, a semiconductor device, such as a semiconductor integrated circuit, a micromachine, or a thin film magnetic head.

Applying the alignment apparatus according to this embodiment to an exposure apparatus makes it possible to provide an exposure apparatus that attains high precision and high throughput by suppressing deterioration in precision due to the influence of deformation of a fine moving stage.

Embodiment of Device Manufacture

Figure 9:
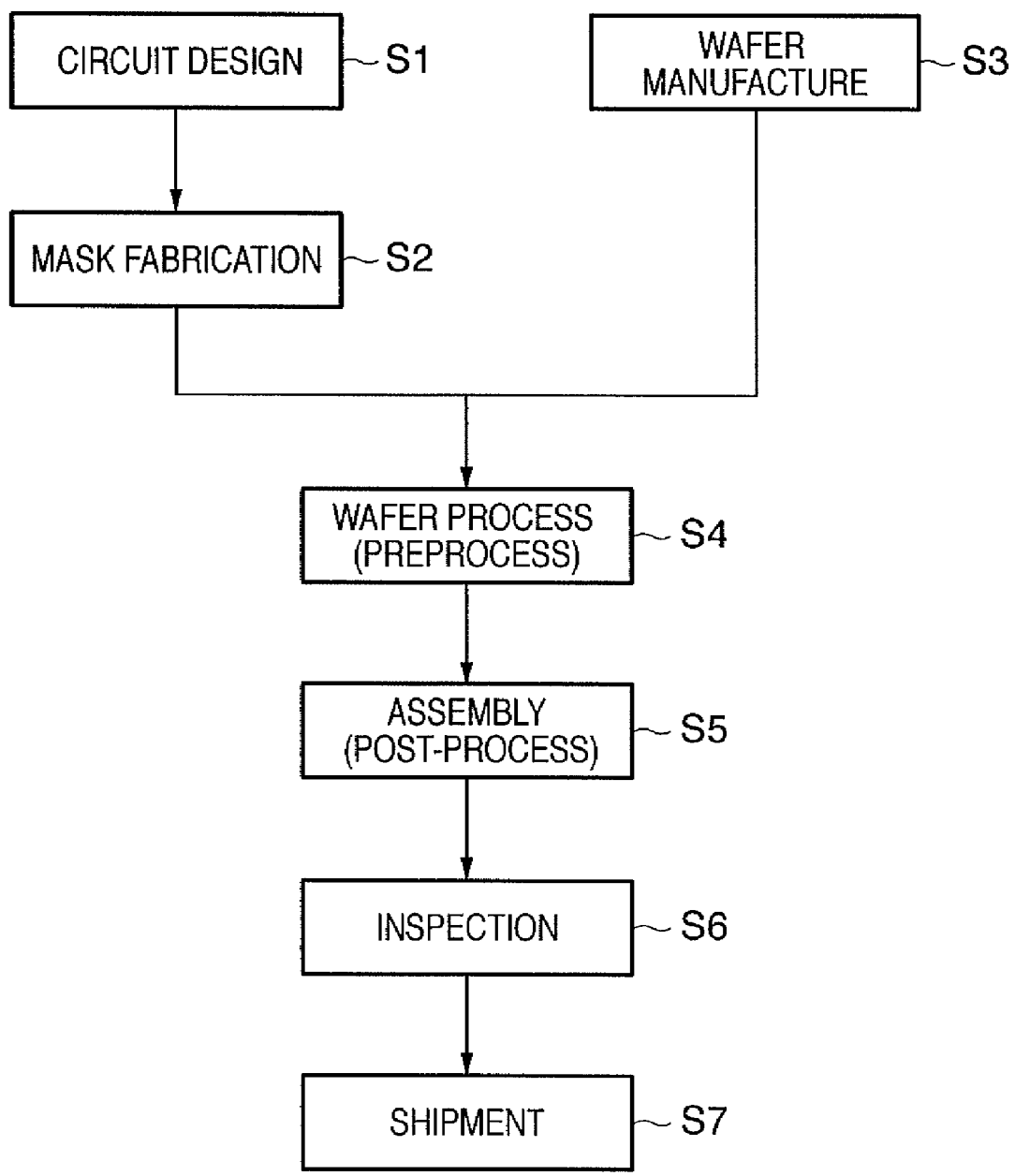
FIG. 9 is a flowchart for explaining the manufacture of a device using an exposure apparatus.

An embodiment of a device manufacturing method using the above-described exposure apparatus will be explained next with reference to FIGS. 9 and 10. FIG. 9 is a flowchart for explaining the manufacture of a device (for example, a semiconductor chip, such as an IC or an LSI, an LCD, or a CCD). A method of manufacturing a semiconductor chip will be exemplified here.

In step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process), called a preprocess, the above-described exposure apparatus forms an actual circuit on the wafer by lithography using the mask and wafer. In step S5 (assembly), called a post-process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped, in step S7.

FIG. 10 is a flowchart illustrating details of the wafer process shown in step S4 in FIG. 9. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted into the wafer. In step S15 (resist processing), a photosensitive agent is applied on the wafer. In step S16 (exposure), the above-described exposure apparatus transfers the circuit pattern of the mask onto the wafer by exposure. In step S17 (development), the exposure wafer is developed. In step S18 (etching), portions other than the developed resist image are etched. In step S19 (resist removal), any unnecessary resist remaining after etching is removed. By repeating these steps, a multilayered structure of circuit patterns is formed on the wafer.

When the exposure apparatus according to this embodiment is used for exposure in such a device manufacturing process, it is possible to produce a device with high precision or high throughput and, consequently, to manufacture a microdevice and/or an inexpensive device.

While the present invention has been described with reference to exemplary embodiments, it is to be understood that the invention is not limited to the disclosed exemplary embodiments. The scope of the following claims is to be accorded the broadest interpretation so as to encompass all such modifications an equivalent structures and functions.

What is claimed is:

1. A stage apparatus which includes a stage and moves the stage in at least a first direction, said stage apparatus comprising:
   a plurality of holding units fixed on the stage to extend in the first direction, the first direction being a longitudinal direction,
   each of said holding units including (i) a first portion, (ii) a second portion arranged between the first portion and the stage, and (iii) a third portion arranged between the second portion and the stage, the first portion including a holding surface configured to hold an object,
   wherein a length of the second portion in the first direction is less than a length of the first portion in the first direction, and the length of the second portion in the first direction is less than a length of the third portion in the first direction,
   wherein ends of the second portion are determined by two slits extending from both ends of said holding units in the first direction towards a central portion of said holding units, and
   wherein the first portion is connected to the third portion at only one point via the second portion.

2. The apparatus according to claim 1, wherein the second portion connects the first portion to the third portion via an elastic hinge.

3. The apparatus according to claim 1, wherein the length of the second portion in the first direction is at most 70% of the length of the first portion in the first direction.

4. A scan type exposure apparatus which project and transfers a pattern drawn on a reticle onto a substrate via a projection optical system, said exposure apparatus comprising:
   a reticle stage apparatus configured to support and to move the reticle,
   said reticle stage apparatus including a stage apparatus defined in claim 1, and wherein the first direction is a scan direction.

5. A device manufacturing method comprising the steps of:
   exposing a substrate to light using an exposure apparatus defined in claim 4; and
   developing the exposed substrate.

6. A scan type exposure apparatus which projects and transfers a pattern drawn on a reticle onto a substrate via a projection optical system, said exposure apparatus comprising:
   a coarse stage apparatus; and
   a fine stage apparatus configured to move on said coarse moving stage apparatus, said fine moving stage apparatus including a stage apparatus defined in claim 1, and wherein the first direction is a scan direction.

7. A device manufacturing method comprising the steps of:
   exposing a substrate to light using an exposure apparatus defined in claim 6; and
   developing the exposed substrate.

8. A stage apparatus which includes a stage and moves the stage in at least a first direction, said stage apparatus comprising:
   a plurality of holding units, each extending along the first direction and having a first surface for holding an object and a second surface which is connected to the stage,
   each of said holding units having a single hinge portion whose ends are determined by two slits extending from both ends of said holding units in the first direction towards a central portion of said holding units,
   wherein a length of the hinge portion in the first direction is less than a length of the first surface in the first direction and a length of the second surface in the first direction.

9. A stage apparatus which includes a stage and moves the stage in at least a first direction, said stage apparatus comprising:
   a plurality of holding units extending along the first direction and having a portion arranged on a side of a holding surface and a portion on a side of a stage, the first direction being a longitudinal direction,
   each of said holding units having a single elastic hinge whose, ends are determined by two slits extending from both ends of said holding units in the first direction towards a central portion of said holding units,
   wherein the portion arranged on the side of the holding surface of each of said holding units is connected to the portion on the side of the stage via only the single elastic hinge.

* * * * *